(12) United States Patent
Williams (10) Patent No.: US 8,334,453 B2
(45) Date of Patent: Dec. 18, 2012

(54) SHAPED TAB CONDUCTORS FOR A PHOTOVOLTAIC CELL

(75) Inventor: Brown Williams, Boston, MA (US)

(73) Assignee: Evergreen Solar, Inc., Marlborough, MA (US)

( * ) Notice: Subject to any disclaimer, the term of this patent is extended or adjusted under 35 U.S.C. 154(b) by 554 days.

(21) Appl. No.: 12/331,522

(22) Filed: Dec. 10, 2008

(65) Prior Publication Data

US 2009/0145479 A1 Jun. 11, 2009

Related U.S. Application Data

(60) Provisional application No. 61/012,795, filed on Dec. 11, 2007, provisional application No. 61/046,045, filed on Apr. 18, 2008, provisional application No. 61/079,178, filed on Jul. 9, 2008.

(51) Int. Cl.
*H01L 31/00* (2006.01)

(52) U.S. Cl. ....................................... 136/256

(58) Field of Classification Search .................. 136/256; 438/98
See application file for complete search history.

(56) References Cited

U.S. PATENT DOCUMENTS

| | | | |
|---|---|---|---|
| 3,350,775 A | 11/1967 | Iles | 29/572 |
| 3,493,822 A | 2/1970 | Iles | 317/234 |
| 3,502,507 A | 3/1970 | Mann | 136/89 |
| 3,589,946 A | 6/1971 | Tarneja et al. | 136/89 |
| 3,903,427 A | 9/1975 | Pack | 250/578 |
| 3,903,428 A | 9/1975 | DeJong | 250/578 |
| 4,104,084 A | 8/1978 | Evans, Jr. | 136/89 |
| 4,135,290 A | 1/1979 | Evans, Jr. | 29/572 |
| 4,181,755 A | 1/1980 | Liu et al. | 430/314 |
| 4,240,842 A | 12/1980 | Lindmayer | 136/256 |
| 4,289,920 A | 9/1981 | Hovel | 136/246 |
| 4,301,322 A | 11/1981 | Amick | 136/256 |
| 4,331,703 A | 5/1982 | Lindmayer | 427/37 |
| 4,652,693 A | 3/1987 | Bar-On | 136/245 |
| 4,695,674 A | 9/1987 | Bar-on | 136/256 |
| 4,860,444 A | 8/1989 | Herrell et al. | 29/840 |

(Continued)

FOREIGN PATENT DOCUMENTS

EP 1936699 6/2008

(Continued)

OTHER PUBLICATIONS

M.M. Hilali, et al., "A Review and Understanding of Screen-Printed Contacts and Selective-Emitter Formation", National Renewable Energy Laboratory, Aug. 2004, 11 pages.

(Continued)

*Primary Examiner* — Jennifer Michener
*Assistant Examiner* — Eli Mekhlin
(74) *Attorney, Agent, or Firm* — Ditthavong Mori & Steiner, P.C.

(57) ABSTRACT

A shaped tab conductor configured to allow more incident light to strike a cell substrate, improving the photovoltaic efficiency of the cell. The shaped tab conductor is configured to reduce the amount of incident light that is blocked by the tab from reaching the surface of the cell substrate. The tab may also be configured to redirect light reflected from the cell surface back to the cell surface. The cross-section of the tab conductor may be polygonal, such as a rhombus, with at least one generally planar surface that forms an acute angle with the substrate.

9 Claims, 7 Drawing Sheets

U.S. PATENT DOCUMENTS

| | | | |
|---|---|---|---|
| 5,151,377 A | 9/1992 | Hanoka et al. | 437/2 |
| 5,158,618 A | 10/1992 | Rubin et al. | 136/244 |
| 5,266,125 A | 11/1993 | Rand et al. | 136/244 |
| 5,380,371 A | 1/1995 | Murakami | 136/256 |
| 5,476,553 A | 12/1995 | Hanoka et al. | 136/251 |
| 5,478,402 A | 12/1995 | Hanoka | 136/251 |
| 5,620,528 A | 4/1997 | Schade et al. | 136/244 |
| 5,726,065 A | 3/1998 | Szlufcik et al. | 437/2 |
| 5,733,382 A | 3/1998 | Hanoka | 136/251 |
| 5,759,291 A | 6/1998 | Ichinose et al. | 136/256 |
| 5,963,790 A | 10/1999 | Matsuno et al. | 438/72 |
| 6,162,658 A | 12/2000 | Green et al. | 438/57 |
| 6,429,037 B1 | 8/2002 | Wenham et al. | 438/57 |
| 6,459,032 B1 | 10/2002 | Luch | 136/244 |
| 6,515,218 B1 | 2/2003 | Shimizu et al. | 136/256 |
| 7,432,438 B2 | 10/2008 | Rubin et al. | 136/256 |
| 7,498,508 B2 | 3/2009 | Rubin et al. | 136/256 |
| 2003/0172969 A1 | 9/2003 | Jenson et al. | 136/252 |
| 2005/0199279 A1 | 9/2005 | Yoshimine et al. | 136/251 |
| 2005/0241692 A1 | 11/2005 | Rubin et al. | 136/256 |
| 2007/0125415 A1 | 6/2007 | Sachs | 136/205 |
| 2007/0144577 A1 | 6/2007 | Rubin et al. | 136/256 |
| 2007/0295381 A1 | 12/2007 | Fujii et al. | 136/244 |
| 2008/0092944 A1 | 4/2008 | Rubin | 136/252 |
| 2008/0227236 A1 | 9/2008 | Luch | 438/73 |
| 2009/0159114 A1 | 6/2009 | Williams et al. | 136/244 |
| 2010/0275976 A1 | 11/2010 | Rubin et al. | 136/251 |

FOREIGN PATENT DOCUMENTS

| | | |
|---|---|---|
| JP | 56010976 | 3/1981 |
| JP | 109956 | 4/2007 |
| JP | 165785 | 6/2007 |
| JP | 173288 | 7/2007 |
| WO | WO 99/23706 | 5/1999 |
| WO | WO 2005/093855 | 10/2005 |
| WO | WO 2005098969 A1 * | 10/2005 |
| WO | WO 2007/122897 | 1/2007 |
| WO | WO 2007/043428 | 4/2007 |
| WO | WO 2007/059551 | 5/2007 |
| WO | WO 2009/076740 | 6/2009 |
| WO | WO 2011/011855 | 2/2011 |

OTHER PUBLICATIONS

Leonid Rubin, Day4 Technology for Conceptually New PV Module Production, Day4 Energy Inc., 6 pages, Undated, however, it appears that this paper has a date no earlier than Jun. 25, 2009 since it cites a PCT Application (WO/2009/076740) that was published on Jun. 25, 2009.

Authorized Officer Jean-Pierre Stirn, *International Search Report and Written Opinion of the International Searching Authority*, International Search Authority, International Application No. PCT/US2008/086156, Jun. 3, 2009, 13 pages.

Authorized Officer Klaus Meierewert, *International Search Report and Written Opinion of the International Searching Authority*, International Searching Authority, International Application No. PCT/US2008/086124, Sep. 28, 2009, 12 pages.

B. Raabe, et al., *High Aspect Ratio Screen Printed Fingers*, 20th European Photovoltaic Solar Energy Conference, Jun. 6-10, 2005, Barcelona, Spain, pp. 930-933.

Jaap Hoornstra, et al., *The Importance of Paste Rheology in Improving Fine Line, Thick Film Screen Printing of Front Side Metallization*, Netherlands Energy Research Foundation, European Photovoltaic Solar Energy Conference, 1997, 4 pages.

A. Schneider, et al., *Day4™ Electrode Technology Preserves Input Solar Cell Efficiency on PV Module Level*, 22nd.

L. Mai et al., New Emitter Design and Metal Contact for Screen-Printed Solar Cell Front Surfaces, Photovoltaic Energy Conversion, Conference Record of the 2006 IEEE, PI, May 1, 2006, pp. 890-893.

\* cited by examiner

SHAPED TAB CONDUCTORS FOR A PHOTOVOLTAIC CELL

This application claims priority from U.S. provisional patent application, Ser. No. 61/046,045, filed Apr. 18, 2008, entitled "PHOTOVOLTAIC CELL WITH TABS FOR REFLECTING LIGHT TOWARD SUBSTRATE," the disclosure of which is incorporated herein, in its entirety, by reference. This patent application also claims priority from provisional U.S. patent application Ser. No. 61/012,795, filed Dec. 11, 2007, entitled, "PHOTOVOLTAIC CELL WITH FINE FINGERS AND METHOD OF MANUFACTURE OF SAME," and naming Brown Williams, Christopher E. Dubé, and Andrew Gabor as inventors, the disclosure of which is incorporated herein, in its entirety, by reference. This patent application also claims priority from provisional U.S. patent application Ser. No. 61/079,178, filed Jul. 9, 2008, entitled, "EFFICIENT PHOTOVOLTAIC CELL," and naming Christopher E. Dubé as inventor, the disclosure of which is incorporated herein, in its entirety, by reference.

RELATED APPLICATION

This patent application is related to U.S. utility patent application Ser. No. 12/331,586, filed on even date herewith, entitled, "PHOTOVOLTAIC CELL WITH FINE FINGERS AND METHOD OF MANUFACTURE OF SAME," and naming Brown Williams, Christopher E. Dubé, and Andrew Gabor as inventors, the disclosure of which is incorporated herein, in its entirety, by reference.

TECHNICAL FIELD

The invention generally relates to photovoltaic cells and, more particularly, the invention relates to photovoltaic cell efficiency.

BACKGROUND

Photovoltaic cells convert light into electrical energy. To that end, a photovoltaic cell has a doped substrate that, when exposed to light, generates charge carriers, such as electrons. Conductors (referred to in the art as a "tabs") coupled with the substrate conduct these electrons to another device, thus producing an electrical current. As an example, one common cell technology collects the charge carriers by forming a plurality of conductive fingers on the substrate. The fingers conduct the collected charge carriers to one or more of the tabs for transmission to another device.

Undesirably, tabs are opaque and thus, prevent some portion of incident light from reaching the substrate.

SUMMARY OF THE INVENTION

In embodiments of the invention, a photovoltaic cell is provided that includes a photosensitive substrate and a plurality of tab conductors in electrical communication with the substrate. At least one tab has a cross-sectional shape with a plurality of surfaces, with at least one of the tab surfaces substantially planar. The planar tab surface forms an acute angle with the top surface of the substrate, the angle being greater than about zero degrees and less than about ninety degrees. In this way, the tab conductor shades less of the substrate from light incident to the cell than in conventional cells and some of the light reflected from the cell surface is redirected to the cell surface, enhancing energy production.

In various embodiments of the invention, the tab conductors are secured to the bus bars on the substrate surface by solder points. Some portions of the tab conductor are not in contact with any solder point and, therefore, the tab conductor provides less shading for the substrate than if the entire length of the tab conductor was soldered to the substrate.

In various embodiments of the invention, the cross-sectional shape of the tab conductor is a polygon, such as a rhombus. In some embodiments of the invention, the cross-sectional shape of a tab conductor has a second surface that is curved and concave or curved and convex. The aspect ratio of the tab, height to width, may be increased to reduce substrate shading by the tab conductor.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

In illustrative embodiments of the invention, a tab conductor is configured to allow more light to strike the cell substrate than is possible with conventional tab construction, improving the photovoltaic efficiency of the cell. The tab may be configured to reduce the amount of incident light that is blocked by the tab from reaching the surface of the cell. The tab may in addition, or alternatively, be configured to redirect light reflected from the cell surface back to the cell surface. To that end, the tab has at least one surface that is shaped and positioned in a manner to direct the reflected light back to the cell surface or reduce light blocked from striking the cell surface. For example, the tab could have a generally planar surface that forms an acute angle with the substrate. Details of illustrative embodiments are discussed below.

Figure 1:
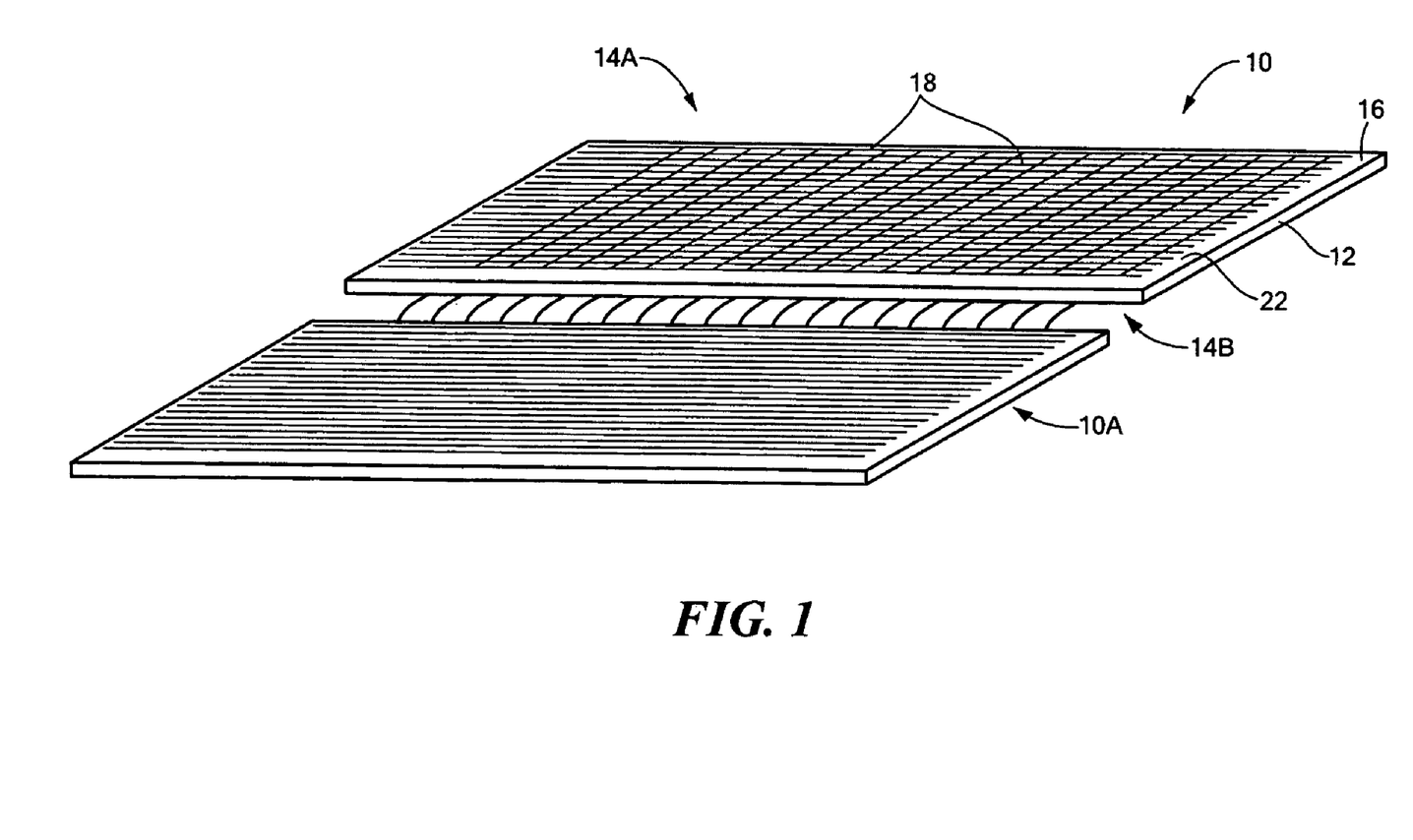
FIG. 1 schematically shows a pair of photovoltaic cells configured in accordance with illustrative embodiments of the invention.

FIG. 1 schematically shows a photovoltaic cell 10 configured in accordance with illustrative embodiments of the invention and connected to a second photovoltaic cell 10A.

The second photovoltaic cell 10A may be configured in the same or in a different manner. In the example shown, the first and second photovoltaic cells 10 and 10A are serially connected to combine their power. Subsequent processes may combine the two photovoltaic cells 10 and 10A with a plurality of additional photovoltaic cells to form a photovoltaic module. The module may contain serially connected cells connected in parallel with other strings of serially connected cells.

Figure 2A:
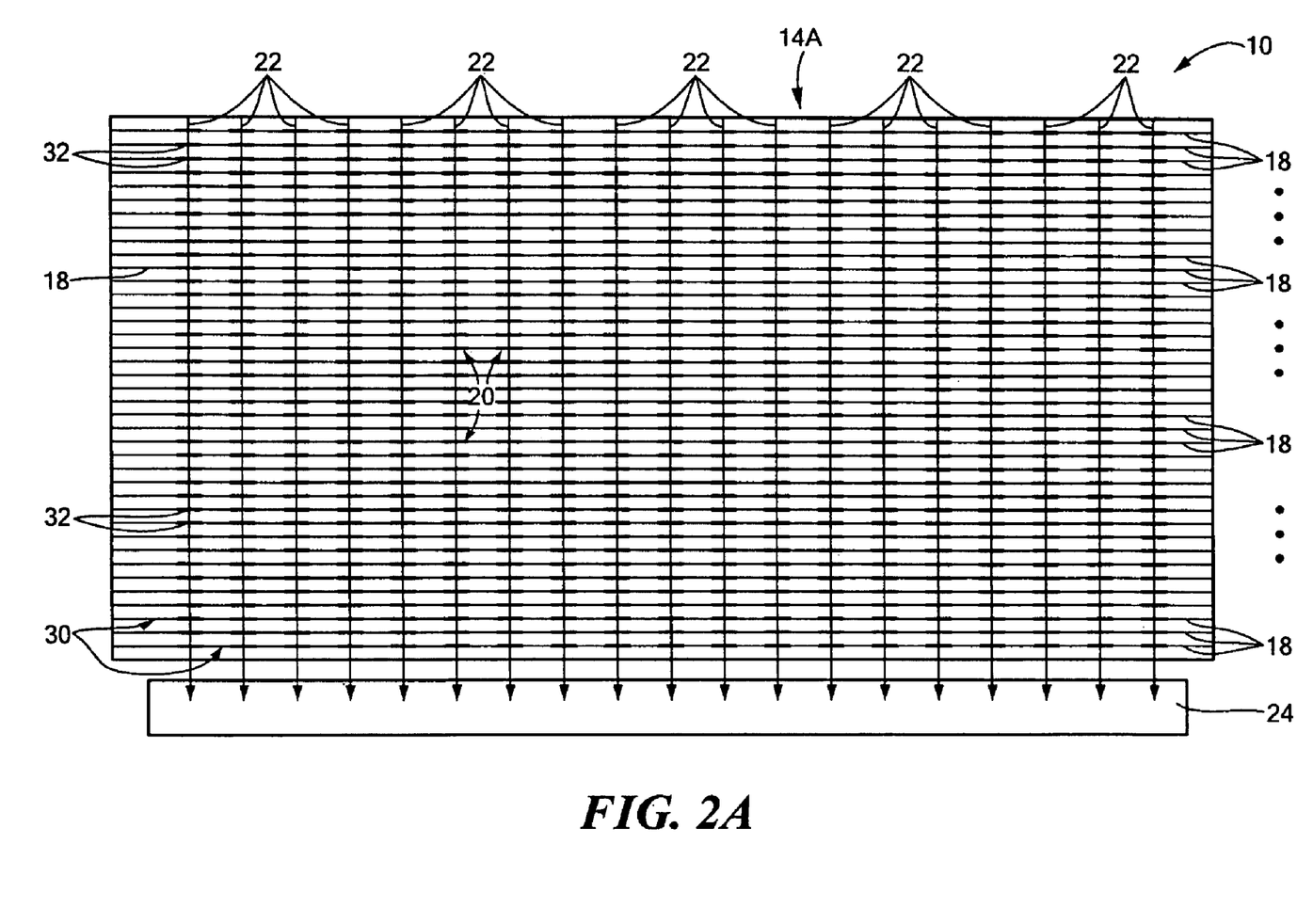
FIG. 2A schematically shows a top view of a photovoltaic cell configured in accordance with illustrative embodiments of the invention.
Figure 2B:
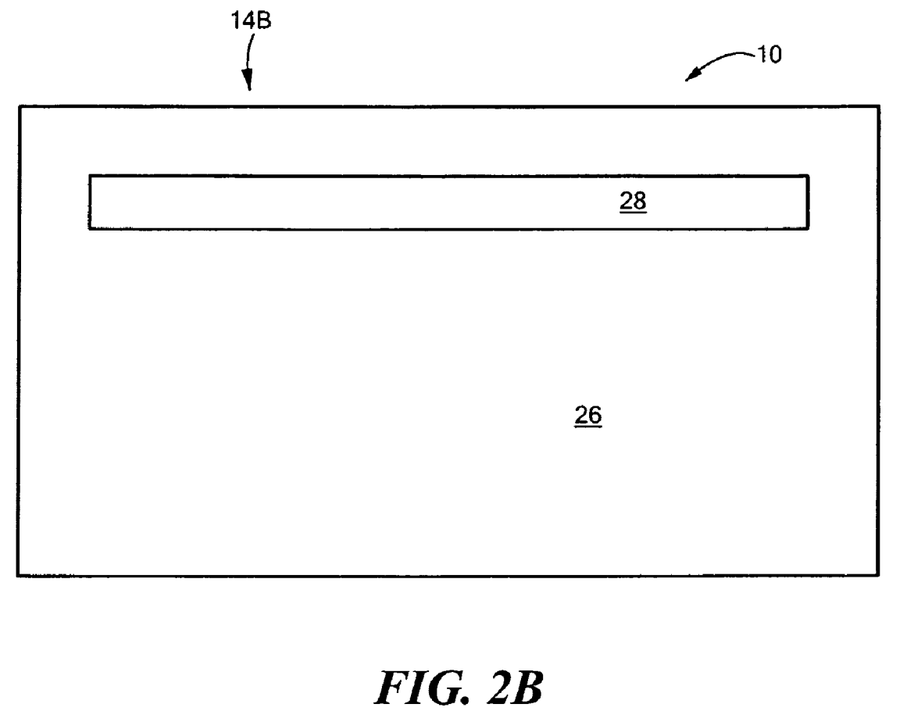
FIG. 2B schematically shows a bottom view of a photovoltaic cell configured in accordance with illustrative embodiments of the invention.

Among other things, the photovoltaic cell 10 has a doped substrate 12 with a plurality of conductors on its top and bottom faces/surfaces 14A and 14B to collect and transmit electricity/current to an external device, such as another photovoltaic cell or an external load. More specifically, FIG. 2A schematically shows a top view of the photovoltaic cell 10, while FIG. 2B schematically shows a bottom view of the photovoltaic cell 10. As shown, the top surface 14A has an antireflective coating 16, a plurality of thin fingers 18 traversing generally lengthwise along the substrate 12, and a plurality of discontinuous bus bars 20 traversing generally along the width of the substrate 12. In the example shown, the bus bars 20 are generally arranged in a pattern that is more or less perpendicular to the fingers 18.

Alternative embodiments, however, may form the bus bars 20 and fingers 18 in different orientations. For example, the fingers 18, bus bars 20, or both could traverse in a random manner across the top face 14A of the substrate 12, at an angle to the fingers 18 and bus bars 20 shown, or in some other pattern as required by the application.

The photovoltaic cell 10 also has a plurality of conductive tabs 22 electrically and physically connected to the bus bars 20. For example, the tabs 22 may be formed from silver plated copper wires. The tabs 22 transmit electrons gathered by the fingers 18 to a metallic strip 24, which can connect to either an external load or another photovoltaic cell (e.g., as shown in FIG. 1).

The top face 14A of the substrate 12 receives light for creating electron-hole pairs. As such, one goal for improving cell efficiency is to minimize the number of components shading/covering portions of the top face 14A. Another goal for improving cell efficiency is to reduce losses caused by light reflecting from the surface of the cell. As discussed in greater detail below, the fingers 18, bus bars 20, and tabs 22 are specially configured toward these goals.

The bottom face 14B of the substrate 12 does not receive light and thus, may be covered. Accordingly, as shown in FIG. 2B, the bottom face 14B of the substrate 12 has a bottom surface metallic covering 26 (e.g., aluminum) with an exposed bottom contact 28 shaped to correspond with the shape of the prior noted metallic strip 24. The photovoltaic cell 10 therefore serially connects with similar photovoltaic cells by connecting their metallic strip 24 to its bottom contact 28, and/or by connecting its metallic strip 24 to their bottom contacts 28. The bottom contacts 28 may be one or more small pads to which the metallic strip 24 is electrically connected.

In accordance with illustrative embodiments, the fingers 18 are much thinner than those known in the art. For example, some or all of the fingers 18 may have thicknesses that are substantially less than about 120 microns. In fact, some embodiments have finger thicknesses equal to or less than about 60 microns. During experiments and simulations, the inventors discovered that fingers 18 having thicknesses as low as about 80 microns, or even as low as 40 microns, still can produce satisfactory, commercially acceptable results when used with appropriately configured bus bars 20. More specifically, after significant experimentation and investment, the inventors were surprised to discover that their cell design with very thin fingers 18 sufficiently tolerated more finger breaks than cell designs having wider fingers, but different bus bar arrangements.

The inventors realized that use of seven, eight, nine, or more (e.g., fifteen or more) closely spaced bus bars 20 could accomplish this favorable result. In addition, an increased number of bus bars 20 further reduces the size of the finger segments 30 (discussed below) between the edge of the substrate 12 and a proximate bus bar 20. As a result, fewer electrons should be trapped in those regions, thus also improving cell efficiency.

Stated another way, bus bars 20 intersect the fingers 18 to form finger segments 30. For example, two bus bars 20 may intersect a single finger 18 to form a finger segment 30 between the two bus bars 20. As another example, a single bus bar 20 may intersect a finger 18 to form a finger segment 30 between the edge of the substrate 12 and the intersecting bus bar 20. In the former case, the distance between the bus bars 20 preferably is very short (e.g., between about 7 and 15 millimeters). If such a finger segment 30 is discontinuous, then an electron on either side of the discontinuity still does not have a long distance to travel to reach one of its proximate bus bars 20. It should be noted that some electrons still may be trapped if the single finger segment 30 has two breaks.

Alternative embodiments, however, do not require such thin fingers 18. For example, multiple bus bars 20 or discontinuous bus bars 20 (discussed below) still should improve efficiency even when used with high conductivity finger segments 30, or relatively wider fingers 18 (e.g., having widths greater than about 120 microns).

Prior art bus bars known to the inventors generally are formed as single, contiguous conductors in electrical contact with multiple fingers 18. To ensure that they transmit a maximum number of electrons from the substrate 12, such bus bars may traverse all of the fingers 18 (as also is the case with illustrative embodiments). Undesirably, however, such bus bars cover an appreciable amount of the top face 14A of the substrate 12—a result antithetical to the above noted goal of minimizing such coverage.

Figure 3:
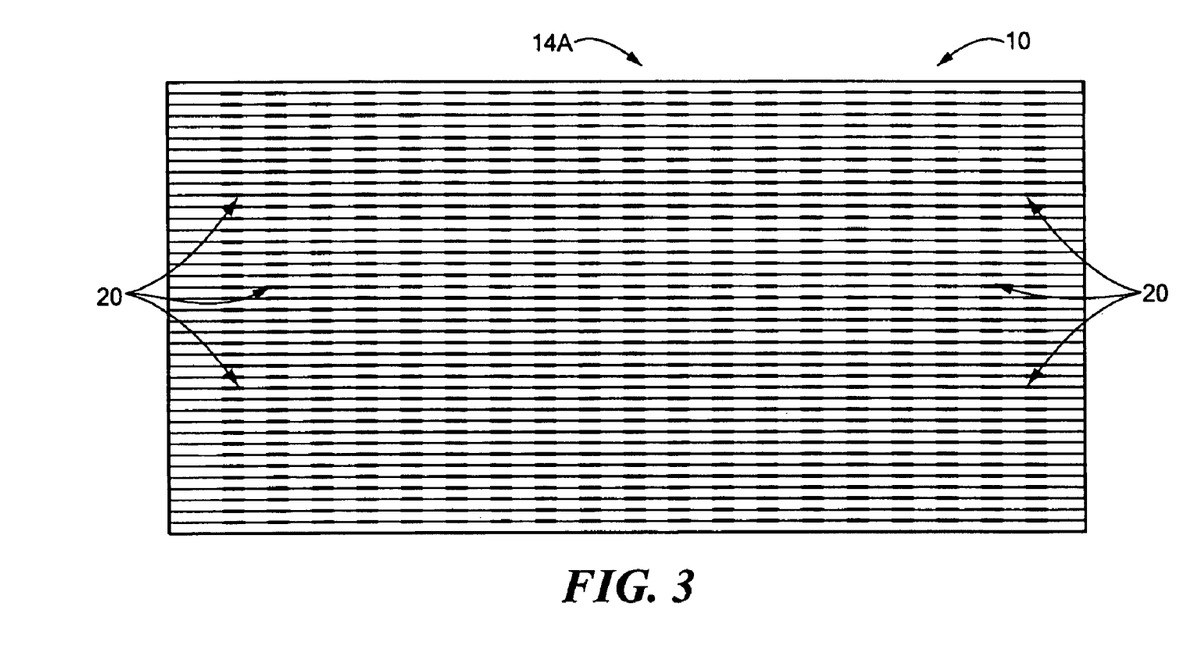
FIG. 3 schematically shows the top view of the photovoltaic cell of FIG. 2 with its tabs removed.
Figure 4:
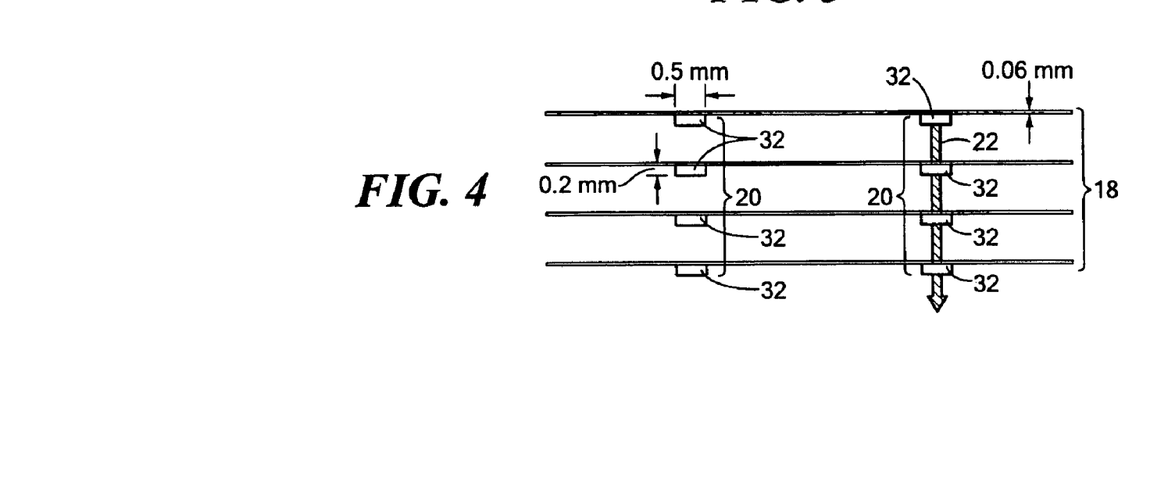
FIG. 4 schematically shows an enlarged view of fingers and bus bars in the photovoltaic cell of FIG. 2.

The inventors solved this problem by creating substantial discontinuities in their bus bar 20, while still maintaining its functionality. Specifically, FIG. 3 schematically shows the top face 14A of the substrate 12 with the tabs 22 removed to more clearly show the bus bars 20. FIG. 4 schematically shows an enlarged view of several fingers 18 and two bus bars 20, with one bus bar 20 coupled to a tab 22. As shown, each bus bar 20 illustratively is formed from a plurality of separated, electrically isolated (across the top surface 14A of the substrate 12) conductive regions 32 that each are connected/integrated with a single finger 18. The conductive regions 32 may be formed in any shape and size sufficient for coupling with a tab 22 (discussed below).

For example, FIG. 4 schematically shows the bus bars 20 as being formed from a plurality of electrically isolated pads (also referred to herein with reference number "32") in electrical contact with the fingers 18. It should be noted that although characterized as "electrically isolated," these pads 32 may have some electrical connection through the substrate 12. Such a connection, however, is not a direct connection, such as that between the pads 32 and a finger 18.

The pads 32 are sized to ensure that conventional soldering or similar processes can readily connect tabs 22 to them in a highly reliable and efficient manner (discussed in greater detail below with regard to FIGS. 6, 7A and 7B). As an example, each pad 32 of FIG. 4 has a width of 500 microns and a (shorter) length of 200 microns. Such dimensions should provide a sufficient soldering site for connecting with relatively thin tabs 22 (e.g., tabs 22 having widths of approximately 150-200 microns) with reasonable tolerances. In some embodiments, the pads 32 are round with a diameter of between about 150 to 200 microns.

In the examples discussed and shown in FIGS. 2A and 2B, the photovoltaic cell 10 has 40 fingers and 19 bus bars with 19 tabs. Accordingly, each bus bar has 40 pads (i.e., one for each finger). If the substrate 12 is 80 millimeters by 150 millimeters, the fingers are 60 microns wide and 150 millimeters long, the tabs are 150 microns wide and 80 mm long, and the pads each are 500 microns wide and 200 microns long, then the following shading occurs on the top surface 14A of the substrate 12:

Finger shading: 40 fingers×0.06 mm width×150 mm length=360 mm squared=3 percent shading, Pad shading: 40 fingers×19 bus bars×0.2 mm length×0.5 mm width=76 mm squared=about 0.6 percent shading, Tab shading: 0.15 mm width×80 mm length×19 tabs=228 mm squared=about 1.9 percent shading.

To determine the total shading, however, the overlapping area between the pads 32 and the tabs 22 must be calculated and subtracted from the sum of the above three calculated areas. This overlapping area is determined as follows:

Overlapping area: 0.2 mm length of pad×0.15 mm width of tab×40 pads×19 tabs fingers=22.8 mm squared Thus:

Total shading for tabs and pads: 76 mm-sq.+228 mm-sq. (minus) 22.8 mm-sq=281.2 mm squared.

Total shading (ignoring, for simplicity, the overlap of the tabs and fingers): 360 mm-sq.+76 mm-sq.+228 mm-sq. (minus) 22.8 mm-sq=641.2 mm squared=about 5.3 percent shading.

In contrast, a corresponding prior art cell with a contiguous, 500 micron wide, 80 mm long bus bar would have a bus bar shading alone as follows:

Prior art bus bar shading: 0.5 mm width×80 mm length×19 bus bars=760 mm squared=6.3 percent shading.

This prior art shading also includes tab shading since such tabs 22 are mounted on top of and within their bus bars 20. Illustrative embodiments therefore favorably reduce substrate coverage by the bus bars 20 in this example by more than 60 percent. Of course, total shading also must include the finger shading, which necessarily increases the above calculated prior art bus bar shading amount (6.3 percent). These specific numbers are illustrative and not intended to limit various embodiments of the invention. It thus is anticipated that illustrative embodiments can reduce the total shading of the substrate top surface 14A by the tabs 22, bus bars 20 and fingers 18 together to be less than about six percent (e.g., between about five and six percent).

Accordingly, discontinuous bus bars 20, such as those discussed above and shown in the figures, provide essentially the same function as prior art bus bars while covering significantly less area of the top face 14A of the substrate 12. Moreover, as known by those skilled in the art, metallization on the top surface 14A of the substrate 12 often degrades the electrical quality of the substrate 12 immediately beneath the surface 14A. The significantly reduced coverage area of the discontinuous bus bars 20 therefore should further reduce the likelihood of this adverse consequence.

It should be noted that the size, shape, and configuration of the discontinuous bus bars 20 is not necessarily limited to the embodiments discussed above. For example, bus bars 20 formed from pads 32 with larger or smaller widths or different shapes, among other things, still can suffice for various applications. Accordingly, discussion of specific examples is for illustrative purposes only and not intended to limit all embodiments of invention.

Some embodiments of the invention do not require discontinuous bus bars 20. For example, some embodiments may have all contiguous bus bars 20, or a combination of contiguous bus bars 20 and discontinuous bus bars 20.

Figure 5:
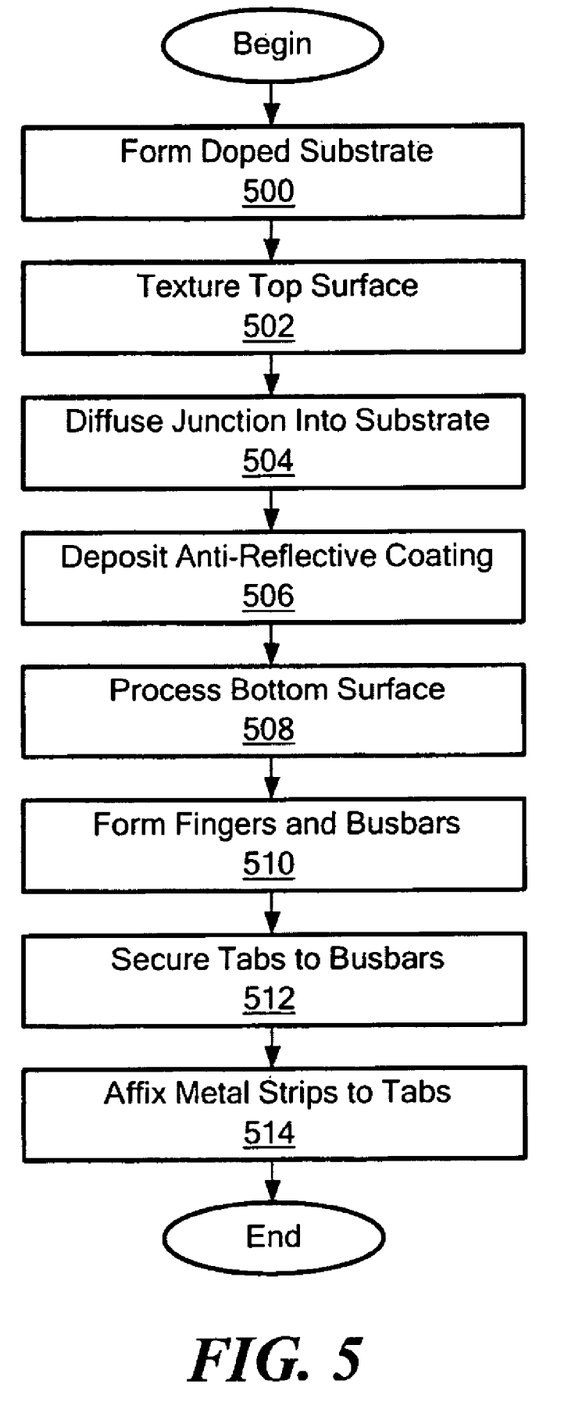
FIG. 5 shows a process of forming a photovoltaic cell in accordance with illustrative embodiments of the invention.

FIG. 5 shows a process for forming the photovoltaic cell 10 in accordance with illustrative embodiments of the invention. It should be noted that for simplicity, this described process is a significantly simplified version of an actual process used to form a photovoltaic cell 10. Accordingly, those skilled in the art should understand that the process may have additional steps not explicitly shown in FIG. 5. Moreover, some of the steps may be performed in a different order than that shown, or at substantially the same time. Those skilled in the art should be capable of modifying the process to suit their particular requirements.

The process begins at step 500, which forms a doped substrate 12. To that end, the process may form any kind of doped substrate appropriate for the intended purposes. Illustrative embodiments form a P-doped string ribbon wafer, such as those produced by Evergreen Solar, Inc. of Marlborough, Mass. As known by those skilled in the art, string ribbon wafers typically are very thin, such as on the order of between about 150 and 300 microns.

After cleaning the surfaces 14A and 14B of the wafer, the process continues to step 502 by texturing the top surface 14A to reduce its shininess. This step should reduce reflections that could minimize the amount of light that excites charged carriers. To that end, conventional processes create a microtexture on the top substrate surface 14A, giving it a "frosty" appearance.

Next, the process diffuses a junction into the substrate 12 (step 504). Specifically, embodiments using a P-doped string ribbon wafer may form a very thin layer of N-type material at the top face 14A of the substrate 12. For example, this layer may have a thickness of about 0.3 microns. Among other ways, the process may apply this layer by spraying a phosphorous doped glass onto the top face 14A of the wafer, and then heating the entire substrate 12 in a furnace. Of course, the junctions may be formed by other means and thus, the noted techniques are discussed for illustrative purposes only.

After removing the substrate 12 from the furnace, the process continues to step 506 by depositing the above noted electrically insulating, antireflective coating 16 to the top face 14A of the substrate 12. In a manner similar to the noted texture, one primary function of the antireflective coating 16 is to increase the amount of light coupled into the photovoltaic cell 10. The antireflective coating 16 may be formed from conventional materials, such as silicon nitride.

The process then continues to step 508, which processes the bottom surface 14B of the substrate 12. To that end, conventional screen-printing processes first form a bottom contact 28 from a silver paste on the substrate 12, and then mask the bottom contact 28 to form the bottom surface metallic covering 26 (e.g., formed from aluminum).

Simultaneously, before, or after processing the bottom surface 14B, the process begins processing the top surface 14A by forming the arrays of fingers 18 and bus bars 20 (step 510). To that end, illustrative embodiments screen-print a highly conductive paste over a mask on the top surface 14A of the substrate 12. To enhance conductivity, illustrative embodiments use a silver paste to form the fingers 18 and bus bars 20.

It should be noted that discussion of screen-printing is for illustrative purposes only. Some or all of the various discussed components can be applied using other technologies. Among other technologies, such embodiments may use inkjet printing or aerojet printing.

After screen-printing both surfaces 14A and 14B, the process passes the substrate 12 through a furnace at a high temperature for a short amount of time. For example, the process may pass the substrate 12 through a furnace at 850 degrees C. for approximately 1 second. This short but quick heating effectively solidifies the conductive paste, and causes the conductive paste to "fire through" the antireflective coating 16. In other words, the conductive paste penetrates through the antireflective coating 16 to make electrical contact with the substrate 12. Accordingly, the fingers 18 and bus bars 20 contact the substrate 12 in a manner that causes their respective current-voltage curves to be substantially linear. Also of significance is the fact that the insulating properties of the antireflective coating 16 prevent a direct electrical connection between two adjacent pads 32 across the top surface 14A. Of course, as noted above, adjacent pads 32 may have some electrical connection through the substrate 12, but such a connection is not the type of direct electrical connection provided by a wire, tab 22, or other direct electrical path.

The process then continues to step 512, which secures the tabs 22 to the bus bars 20. To that end, conventional processes first may screen-print solder onto each of the pads 32, and then use a hotplate to melt the solder. At this stage, each pad 32 of a bus bar 20 has a solder ball for receiving a tab 22. Scaffolding can be used to hold a row of tabs 22 under tension and then move the tabs downwardly to contact each solder ball. The solder balls then cool and secure the tabs 22 to the pads 32. One advantage of using solder balls in this process is their ability to connect securely with the tabs 22 despite irregularities in the contour of the pads 32 and substrate 12. Note that the tabs 22 electrically connect indirectly with the substrate 12 via the pads 32 only. The non-conductive antireflective coating/layer 16 prevents the tabs 22 from directly electrically connecting with the substrate 12 through any other portion of the top surface 14A of the substrate 12.

The process concludes at step 514 by affixing the metal strip 24 (see FIG. 2A) to the tabs 22. Any conventional means for making this connection should suffice, such as conventional soldering techniques.

Shaped Tab Conductors

In various embodiments of the invention, the tabs 22 are constructed to permit a larger fraction of the light incident on the cell to reach the substrate than in conventional implementations. Only light that reaches the substrate can contribute to energy delivered by the photovoltaic cell. Increased energy delivery is achieved by a combination of shape, placement, and surface composition of the tab conductors so that more incident light reaches the substrate directly and more light reflected by the antireflective coating/layer 16 away from the substrate 12 is reflected back toward the substrate 12 by the tab conductor.

The tab conductors 22 may be shaped in any of a number of different ways to enhance light collection efficiency. For example, the tabs 22 may have a generally rhombic cross-sectional shape, e.g., a diamond, as shown in perspective in FIG. 6A. These diamond-shaped tabs 22 are oriented and attached to the top surface 14A of the cell so that two sides of the tab conductor form acute angles ("A" and "B") with the top surface 14A. FIG. 6B shows the tab conductor in cross-section at the tab position labeled 62 in FIG. 6A. This tab conductor 22 shape and orientation with respect to the top surface 14A advantageously allows (1) light incident 64 on the cell at a shallow angle θ to the top surface 14A, at positions normally shaded by the tab, to reach the top surface and (2) light 66 reflected from the top surface 14A to be reflected back to the top surface by faces of the tab conductor. Light collection by the cell is thereby enhanced.

In various embodiments of the invention, the cross-section of the tab conductors may be shaped, for example, in any polygonal shape, such as a triangle, a square, a rectangle, a parallelogram, a rhombus, or an octagon, etc. Further, the tab conductor may assume any generally polygonal shape with one or more faces of the polygon curved, rather than planar. The curved face may be either concave or convex with respect to the central axis of the tab conductor. In other embodiments, the tab conductor can have a cross-sectional shape of any conic section, such as an ellipse. Further, a portion of the perimeter of the conic section may be concave rather than convex. In some embodiments of the invention, irregularly shaped tabs 22 may be employed. The aspect ratio of the tab conductor, i.e., ratio of width to height, can vary with the height exceeding the width and vice versa. Smaller aspect ratios reduce direct shading of the top surface 14A to incident light, but may reduce the amount of light re-reflected by the tab conductor to the top surface.

Figure 6A:
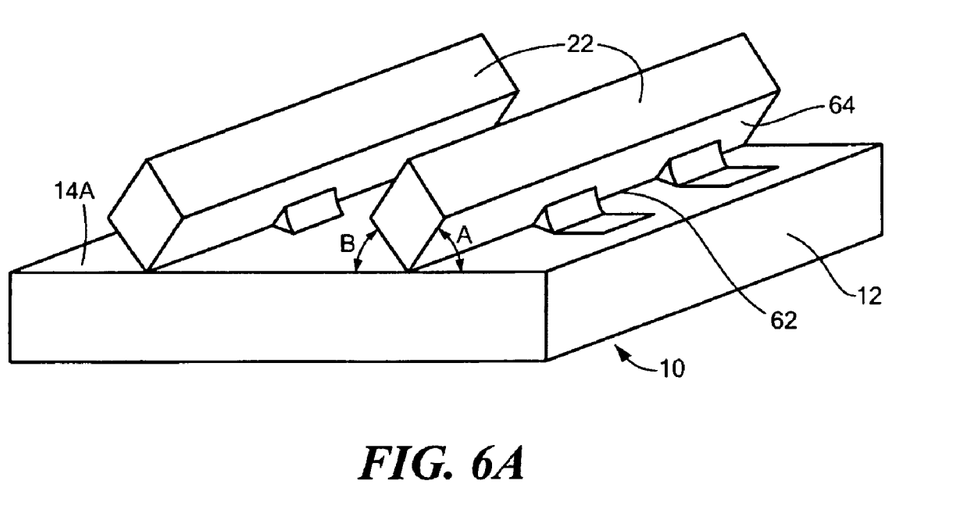
FIG. 6A schematically shows a portion of a photovoltaic cell with diamond-shaped tab conductors, in accordance with illustrative embodiments of the invention.
Figure 6B:
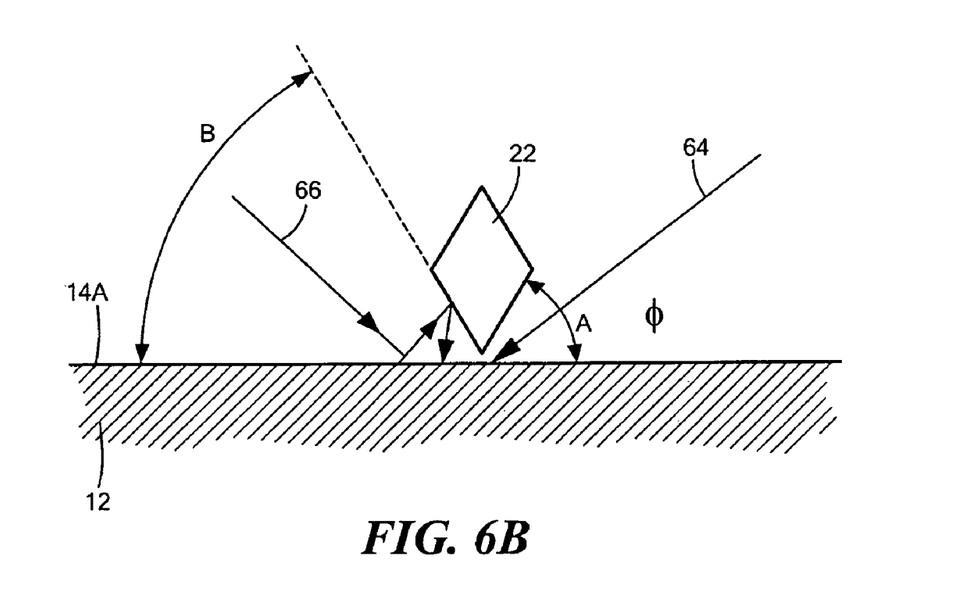
FIG. 6B schematically the tab conductor of FIG. 6A in cross-section.
Figure 7A:
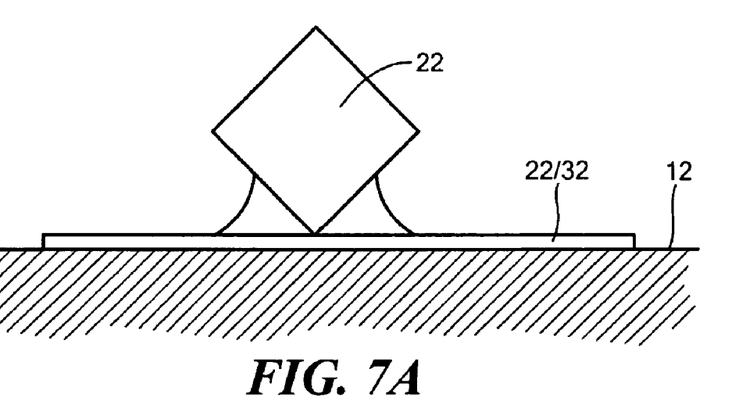
FIG. 7A schematically shows a cross-sectional view of a portion of the photovoltaic cell of FIG. 6A-6B at a solder point.
Figure 7B:
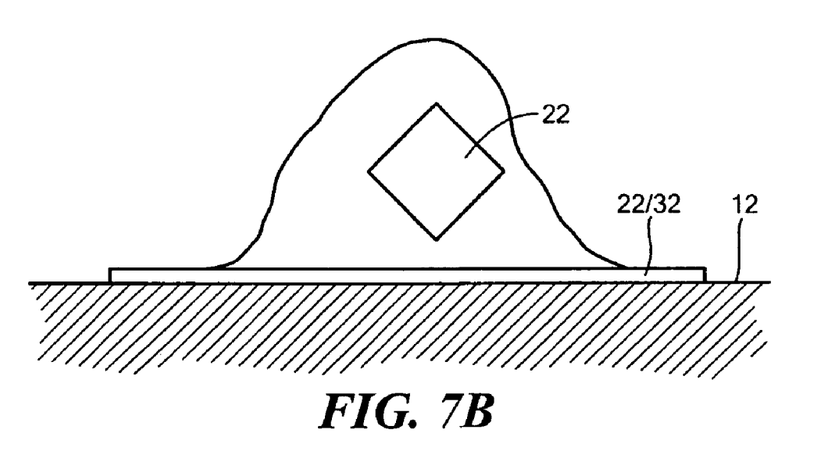
FIG. 7B schematically shows a cross-sectional view of an alternative arrangement for securing a tab conductor to a bus bar.

The angles A and B for the tab conductor shown in FIGS. 6A and 6B may be the same or different. For example, both the angles A and B may be 45 degrees. As another example, angle A may be 60 degrees, while angle B may be 40 degrees. Accordingly, in such an example, the angle formed between the two relevant tab surfaces is 80 degrees. Angles A and B preferably each are greater than about zero degrees but less than about 90 degrees. In embodiments of the invention, at least one face of a tab conductor forms an acute angle with the top surface of the cell. In specific embodiments, the angle formed by the conductor face to the top surface is in the range from 5 degrees to 85 degrees.

The tab conductors may comprise any material that conducts electricity. The tabs may, for example, be conventional metallic wires. In some embodiments, the conductive material is copper or aluminum. In some embodiments, copper wire is clad with silver. In other embodiments, the wire can comprise a nickel iron alloy. Alternatively, the wire can be a copper-invar composite. The wire can include about 30% to about 90% copper by volume. The copper-invar composite can have a ratio of about 50% copper to about 50% invar by volume. In other embodiments, the conductor can be formed from a non-metallic composite material. The surface of the conductors may be shiny (i.e., polished) to enhance specular light reflection or textured to enhance diffuse light reflection.

As noted above, illustrative embodiments solder the tabs 22 to the bus bars 20. FIGS. 7A and 7B schematically show two different ways of soldering the tabs 22 to the bus bars 20. Specifically, FIG. 7A schematically shows a cross-sectional view of the arrangement of FIG. 6 across one tab 22. As shown, solder contacts only the bottom part of the tab 22—it does not completely encapsulate that entire portion of the tab 22. This is in contrast to the embodiment shown in FIG. 7B, in which solder completely encapsulates the entire surface of the tab 22. The solder in both noted embodiments, however, only contacts specific portions of each tab 22 (referred to as "solder points"). Accordingly, significant portions of the tabs 22 are exposed and, thus, not encapsulated at all. Those portions of the tabs 22 that are exposed, therefore, should provide the light reflection benefits discussed above. Specifically, those portions of the tabs 22 that are exposed should reflect more light back to the top surface 14A than conventional tabs 22, which have generally circular cross-sectional shapes. The exposed portions of the tab conductors, such as portion 62 in FIG. 6A, also shade the top surface 14A of the cell from incident light less than tab portions at solder points. The path of the tab conductors as applied to the top surface 14A may be generally straight, as shown in FIG. 6A or may take any other shaped path across the top surface of the cell 14A. The placement of tab conductors on the top surface is dictated by placement of bus bars, to which the tabs are soldered. In general, minimizing the length of the tab conductors reduces shading.

In a manner discussed above with regard to other embodiments, solder connects securely with the tabs 22 despite irregularities in the contour of the substrate 12 and/or the bus bars 22/32.

Accordingly, illustrative embodiments should improve cell efficiency by one or a combination of several factors, including:
- use of thinner fingers 18,
- higher numbers of continuous and/or discontinuous bus bars 20, and/or
- tabs 22 oriented and shaped to reflect light back to the surface 14A and/or allow more incident light to reach the surface 14A.

Similarly, it is of course apparent that the present invention is not limited to the detailed description set forth above. Various changes and modifications of this invention as described will be apparent to those skilled in the art without departing from the spirit and scope of this invention as defined in the appended clauses.

What is claimed is:

1. A photovoltaic cell comprising:
   a photosensitive substrate having a top surface; and
   a plurality of tab conductors extending in a first direction for a first distance in electrical communication with the top surface of the substrate, at least one of the plurality of tab conductors having a cross-sectional shape in a second direction transverse to the first direction, the cross-sectional shape extending for a second distance less than the first distance and having a plurality of surfaces, at least one of the surfaces being substantially planar, where the at least one planar surface forms an acute angle with the top surface of the substrate, the angle being greater than about zero degrees and less than about ninety degrees.

2. A photovoltaic cell according to claim 1, further comprising:
   a plurality of fingers in electrical contact with the substrate;
   a plurality of bus bars in electrical contact with the fingers, each of the plurality of tab conductors being in electrical contact with at least one of the bus bars; and
   a plurality of solder points securing the at least one tab conductor to at least one of the bus bars.

3. A photovoltaic cell according to claim 2, wherein at least one length segment of the at least one tab conductor is adjacent to two solder points and is not in contact with any solder point.

4. A photovoltaic cell according to claim 2, wherein at least one of the solder points secures the at least one tab conductor to the at least one bus bar at a tab conductor portion, the tab conductor portion being partially exposed.

5. A photovoltaic cell according to claim 1, wherein the cross-sectional shape of the at least one tab conductor is a polygon.

6. A photovoltaic cell according to claim 5, wherein the cross-sectional shape of the at least one tab conductor is a rhombus.

7. A photovoltaic cell according to claim 1, wherein the aspect ratio of the at least one tab conductor is less than two.

8. A photovoltaic cell according to claim 1 wherein the cross-sectional shape of the at least one tab conductor includes a second surface that is curved and concave.

9. A photovoltaic cell according to claim 1 wherein the cross-sectional shape of the at least one tab conductor includes a second surface that is curved and convex.

* * * * *